United States Patent
Xi et al.

(10) Patent No.: US 10,347,659 B2
(45) Date of Patent: Jul. 9, 2019

(54) DISPLAY PANEL, ELECTROLUMINESCENT DISPLAY PANEL, AND DISPLAY DEVICE

(71) Applicant: SHANGHAI TIANMA AM-OLED CO., LTD., Shanghai (CN)

(72) Inventors: Kerui Xi, Shanghai (CN); Tingting Cui, Shanghai (CN); Zhonglan Cai, Shanghai (CN); Zuzhao Xu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 15/873,915

(22) Filed: Jan. 18, 2018

(65) Prior Publication Data

US 2018/0145093 A1 May 24, 2018

(30) Foreign Application Priority Data

Sep. 8, 2017 (CN) .......................... 2017 1 0806026

(51) Int. Cl.
| | |
|---|---|
| H01L 27/12 | (2006.01) |
| H01L 27/32 | (2006.01) |
| H01L 29/423 | (2006.01) |
| G06F 13/40 | (2006.01) |
| H01L 29/417 | (2006.01) |
| G02F 1/1362 | (2006.01) |
| H01L 51/52 | (2006.01) |

(52) U.S. Cl.
CPC .... *H01L 27/1214* (2013.01); *G02F 1/136286* (2013.01); *G06F 13/40* (2013.01); *H01L 27/3248* (2013.01); *H01L 29/41733* (2013.01); *H01L 29/42384* (2013.01); *G02F 1/136213* (2013.01); *H01L 51/5203* (2013.01)

(58) Field of Classification Search
CPC .. G02F 1/13436; G02F 1/333; G02F 1/13781; G09G 3/3611

See application file for complete search history.

(56) References Cited

U.S. PATENT DOCUMENTS

| | | | | |
|---|---|---|---|---|
| 2015/0187279 | A1* | 7/2015 | Lee | G09G 3/3225 257/40 |
| 2015/0262528 | A1* | 9/2015 | Takahara | G09G 3/3225 345/212 |
| 2018/0158417 | A1* | 6/2018 | Xiang | G09G 3/3233 |

* cited by examiner

*Primary Examiner* — Kyoung Lee
*Assistant Examiner* — Christina A Sylvia
(74) *Attorney, Agent, or Firm* — Kilpatrick Townsend & Stockton LLP

(57) ABSTRACT

A display panel is described. Further, an electroluminescent display panel and a display device are described. By arrangement of a second signal bus line, a first end of a first signal line in a first display area in the display panel is electrically connected with the first signal bus line, and the second end of the first signal line is electrically connected with a first conducting wire in the second signal bus line, so that uniformity of a signal input by the first signal line in the first display area can be ensured. Therefore, the structure is not only the precondition of ensuring signal uniformity of the first display area, but is also the precondition of ensuring signal uniformity of a display area of the entire display panel.

34 Claims, 15 Drawing Sheets

Fig.1 RELEVANT ART

DISPLAY PANEL, ELECTROLUMINESCENT DISPLAY PANEL, AND DISPLAY DEVICE

CROSS-REFERENCE TO RELATED APPLICATIONS

This application claims the priority to Chinese Patent Application No. CN201710806026.9, filed on Sep. 8, 2017, the content of which is hereby incorporated by reference in its entirety.

FIELD

The present disclosure relates to the field of display technologies, and in particular to a display panel, an electroluminescent display panel, and a display device.

BACKGROUND

With the development of display screen technologies, full screens come into being. Compared with an ordinary display screen, a full screen has a larger proportion of a display area and has ultra-narrow borders, which can greatly improve the visual experience of viewers. However, it's precisely because of the ultra-narrow borders of the full screen that circuits and wiring in peripheral areas need to be subjected to special configurations during manufacture of the full screen, so as to reduce the area occupied by the borders as much as possible, and increase the proportion of the display area. Left and right border areas of a display panel can be narrowed by appropriate wiring. However, an upper border or a bottom border of the display panel, where the display panel further includes components such as a camera, an earpiece and the like, cannot be entirely used for display. As a result, the proportion of the display area cannot be further increased, which greatly affects the display effect of pictures.

In view of this challenge, how to ensure the display effect of pictures while increasing the proportion of the display area is a technical problem that urgently needs to be solved by those skilled in the art.

SUMMARY

Embodiments of the present disclosure provide a display panel, an electroluminescent display panel and a display device, which are used for solving the existing problem about how to ensure the display effect of pictures when improving a duty ratio of a display area.

An embodiment of the present disclosure provides a display panel including a first display area, a second display area, and an intermediate area arranged between the first display area and the second display area. The display panel further includes a first signal bus line and a second signal bus line, and the second signal bus line includes a first conducting wire. The first signal bus line at least partially surrounds an edge of the first display area away from the intermediate area. The second signal bus line at least partially surrounds an edge of the intermediate area closest to the first display area. A first signal line is arranged in the first display area, one end of the first signal line is electrically connected to the first signal bus line, and the other end of the first signal line is electrically connected to the first conducting wire.

In another aspect, an embodiment of the present disclosure further provides an electroluminescent display panel, including a first display area, a second display area and a hollow area arranged between the first display area and the second display area. The electroluminescent display panel further includes a first signal bus line, a second signal bus line and a third signal bus line. The first signal bus line at least partially surrounds an edge of the first display area away from the hollow area. The second signal bus line at least partially surrounds an edge of the hollow area closest to the first display area and the second display area. The third signal bus line at least partially surrounds an edge of the second display area away from the hollow area. A first signal line is arranged in the first display area. One end of the first signal line is electrically connected to the first signal bus line, and the other end of the first signal line is electrically connected to the second signal bus line. A second signal line is arranged in the second display area. One end of the second signal line is electrically connected with the second signal bus line, and the other end of the second signal line is electrically connected with the third signal bus line.

In yet another aspect, an embodiment of the present disclosure further provides a display device, including the abovementioned display panel according to the embodiment of the present disclosure, or the abovementioned electroluminescent display panel according to the embodiment of the present disclosure.

DETAILED DESCRIPTION OF THE EMBODIMENTS

Embodiments of a display panel, an electroluminescent display panel and a display device according to embodiments of the present disclosure will be illustrated in detail in connection with the drawings. It should be noted that the described embodiments are just a part but not all of the embodiments of the present disclosure. Based on the embodiments of the present disclosure, all other embodiment(s) which can be obtained by those skilled in the art without any inventive work should be within the scope of protection of the present disclosure.

Figure 1:
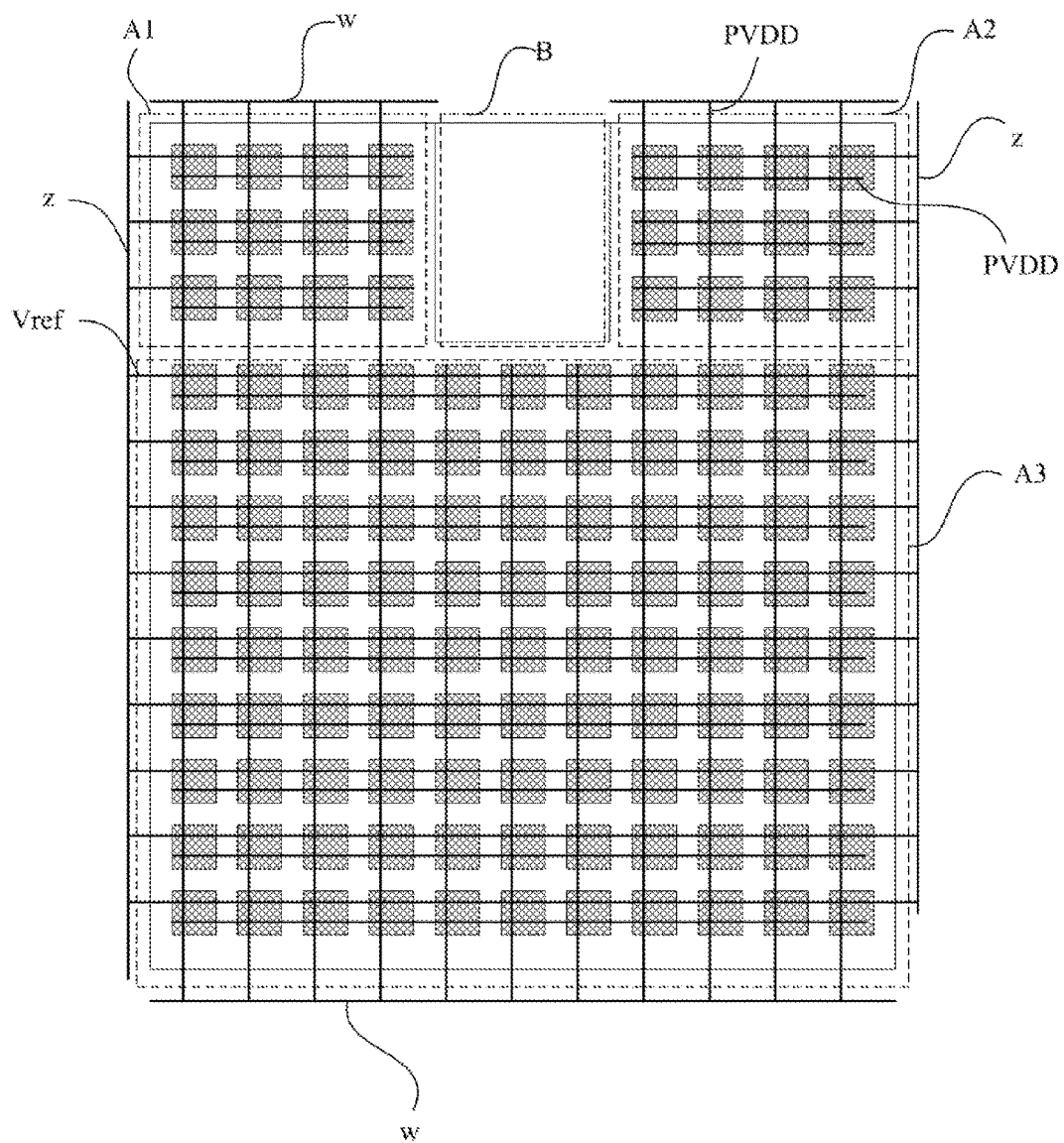
FIG. 1 is a structural schematic diagram of a conventional display panel.

The applicant finds in study that if an area of an upper border or a bottom border of a display panel, where a component such as a camera is not placed, is used for display, the entire display area will show an irregular outline and a relatively high proportion of the display area can be achieved. As shown in FIG. 1, a display panel includes three display areas (e.g., a first display area A1, a second display area A2 and a third display area A3, which are outlined with dotted lines, similarly hereinafter) and a non-display area (e.g., a B area). At least two reference signal lines Vref and at least two power supply voltage signal lines PVDD are arranged in all of the three display areas. In order to reduce a voltage difference among reference signals input by each reference signal line Vref and a voltage difference among power voltage signals input by each power supply voltage signal line PVDD, generally, reference signal lines Vref in each display area are electrically connected via a signal bus line z, power supply voltage signal lines PVDD in each display area are electrically connected via a signal bus line w, and an electrical connection mode is shown in FIG. 1.

However, due to existence of a voltage drop, potentials of a reference signals input by a reference signal line Vref are different at one end closest to the signal bus line z and at another end away from the signal bus line z, so that signals in the first display area A1 are non-uniform, and signals in the second display area A2 are non-uniform. Meanwhile, the non-display area B is positioned between the first display area A1 and the second display area A2, and thus, the reference signal lines Vref arranged in the first display area A1 cannot be electrically connected with the reference signal lines Vref arranged in the second display area A2, resulting in that the reference signals in the first display area A1 and the second display area A2 are different and similarly, the power voltage signals in the first display area A1 and the second display area A2 may also be different and finally causes inconsistent display effects of the first display area A1 and the second display area A2 to influence a viewing effect.

Therefore, an embodiment of the present disclosure provides a display panel for effectively improving a proportion of a display area and solving the problem of difference among the signals in the first display area A1 or among the signals in the second display area A2 and improving uniformity of the signals in two display areas, respectively, so as to improve the display effect of display pictures.

Figure 2:
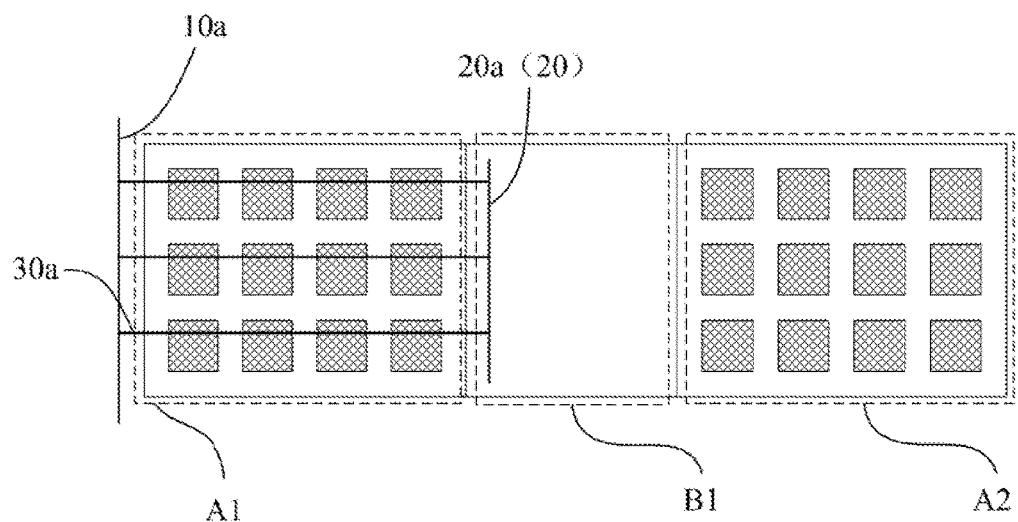
FIG. 2 is a structural schematic diagram of a display panel according to an embodiment of the present disclosure.
Figure 3:
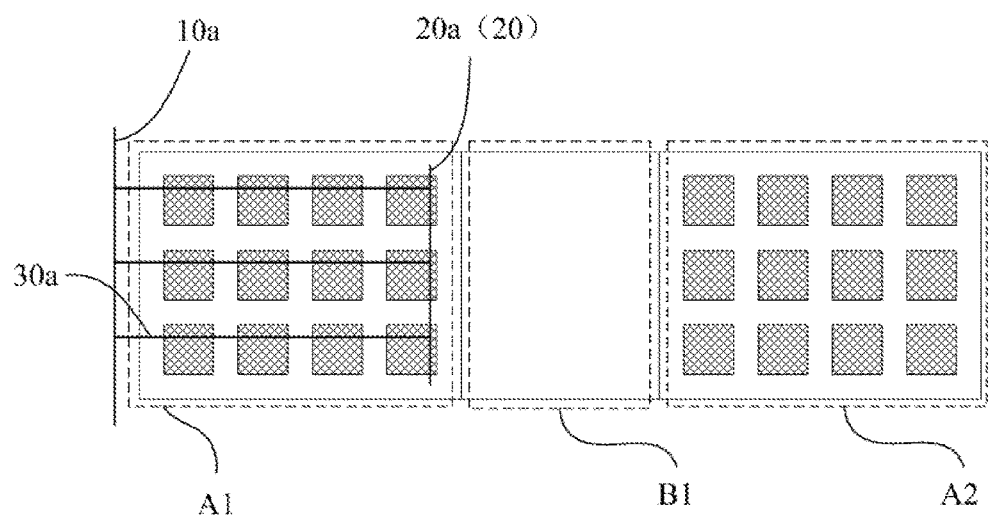
FIG. 3 is a structural schematic diagram of a display panel according to an embodiment of the present disclosure.

Particularly, according to the display panel according to the embodiment of the present disclosure, as shown in FIG. 2 and FIG. 3, in order to facilitate illustration, in the drawings, by taking a signal line extending along a row direction as an example, a connection relationship between the signal line and a second signal bus line 20 is explained and illustrated. The display panel may include a first display area A1, a second display area A2, and an intermediate area B1 arranged between the first display area A1 and the second display area A2. The display panel may further include a first signal bus line 10a and a second signal bus line 20. The second signal bus line 20 includes a first conducting wire 20a. The first signal bus line 10a at least partially surrounds an edge of the first display area A1 away from the intermediate area B1. The second signal bus line 20 at least partially surrounds an edge of the intermediate area B1 closest to the first display area A1. A first signal line 30a is arranged in the first display area A1, one end of the first signal line 30a is electrically connected to the first signal bus line 10a, and the other end of the first signal line 30a is electrically connected to the first conducting wire 20a.

According to the display panel according to the embodiment of the present disclosure, by arrangement of the first conducting wire 20a in the second signal bus line 20, one end of the first signal line 30a in the first display area A1 is electrically connected with the first signal bus line 10a, and the other end of the first signal line 30a is electrically connected with the first conducting wire 20a, so that uniformity of a signal input by the first signal line 10a in the first display area A1 can be ensured. Therefore, the structure not only is the precondition of ensuring signal uniformity of the first display area A1, but also is the precondition of ensuring signal uniformity of the display area of the integral display panel, and may be beneficial for improving the display effect of the display panel, thereby improving the visual experience of a viewer.

In one embodiment, the intermediate area B1 may be a display area, is used for displaying a low-resolution image, such as a clock, a reminding icon or other low-resolution images and the like; therefore, in the display panel according to the embodiment of the present disclosure, the intermediate area B1 is generally set as a non-hollow area; certainly, the intermediate area B1 may also be set as a transparent area so as to fabricate an earpiece, a sensor or a front-facing camera part in the area; and therefore, in the display panel according to the embodiment of the present disclosure, the intermediate area B1 is generally set as a non-display area.

Figure 4:
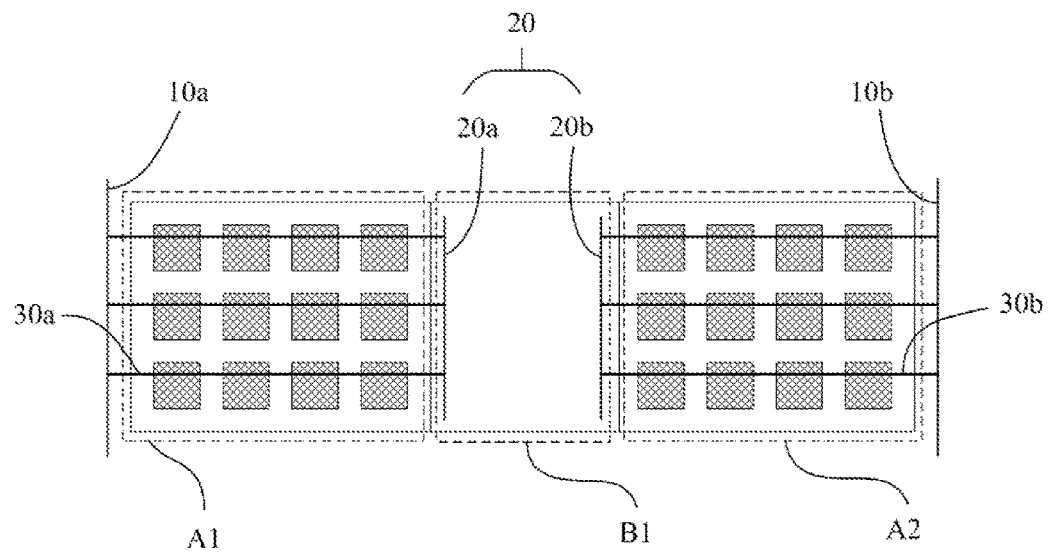
FIG. 4 is a structural schematic diagram of a display panel according to an embodiment of the present disclosure.
Figure 5:
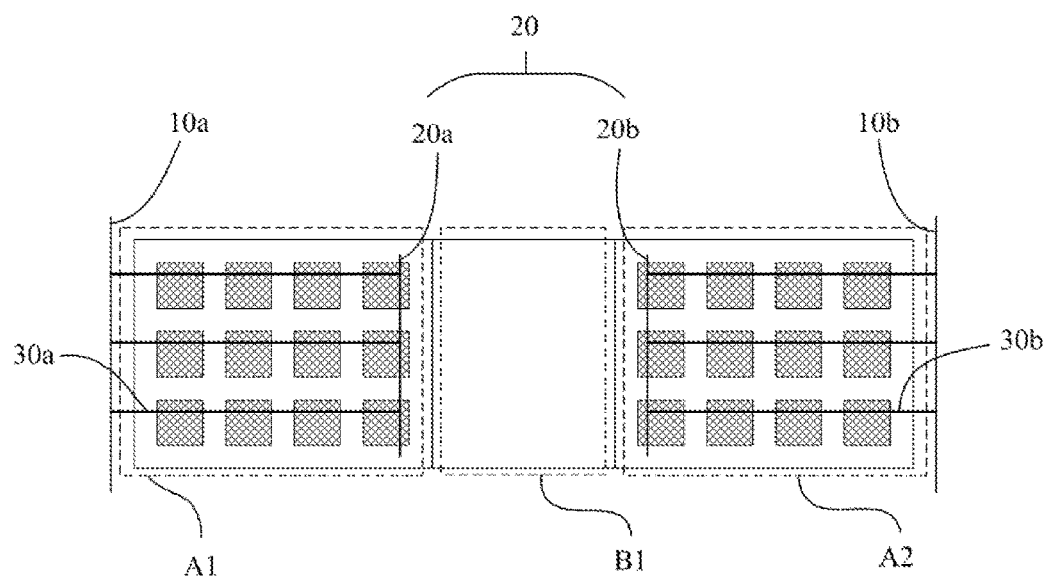
FIG. 5 is a structural schematic diagram of a display panel according to an embodiment of the present disclosure.

In one embodiment, the display panel not only includes the first display area A1, but also includes the second display area A2, and thus, in order to achieve a display function of the second display area A2, a second signal line is also arranged in the second display area A2. Certainly, in order to enable signals input by each second signal line in the second display area A2 to have uniformity, similarly, second signal line may need to be electrically connected, and a third signal bus line may be arranged at an edge of the second display area A2, so that one end of the second signal line is electrically connected with the third signal bus line. However, due to existence of the voltage drop, potentials of a signal input by a second signal line are different at one end away from the third signal bus line and at one end closest to the third signal bus line such that display effects of the second display area A2 are influenced. Therefore, in order to improve the display effects of the second display area A2, the display panel according to the embodiment of the present disclosure, as shown in FIG. 4 and FIG. 5, further includes the third signal bus line 10b. The third signal bus line 10b at least partially surrounds the edge of the second display area A2 away from the intermediate area B1. The second signal bus line 20 further includes a second conducting wire 20b. The second signal line 30b is arranged in the second display area A2. One end of the second signal line 30b is electrically connected with the third signal bus line 10b, and the other end of the second signal line 30b is electrically connected with the second conducting wire 20b.

Particularly, in the display panel according to the embodiment of the present disclosure, by arrangement of the second conducting wire 20b in the second signal bus line 20, one end of the second signal line 30b in the second display area A2 is electrically connected with the third signal bus line 10b, and the other end of the second signal line 30b is electrically connected with the second conducting wire 20b, so that uniformity of a signal input by the second signal line 30b in the second display area A2 can be ensured. The structure is the precondition of ensuring signal uniformity of the second display area A2 in the display panel, and may be beneficial for improving the display effects of the display panel.

Particularly, by arrangement of the first conducting wire 20a and the second conducting wire 20b in the second signal bus line 20, electrical connection of the first signal bus line 30a and the second signal bus line 30b is implemented, so that the signal input by the first signal line 30a and the signal input by the second signal line 30b have the same potential. And certainly, the first conducting wire 20a and the second conducting wire 20b also have the same potential, so that based on signal uniformity in the first display area A1 and signal uniformity in the second display area A2, signal uniformity in the first display area A1 and the second display area A2 is ensured, the display difference between two display areas is eliminated, and the display effects is improved.

Figure 6:
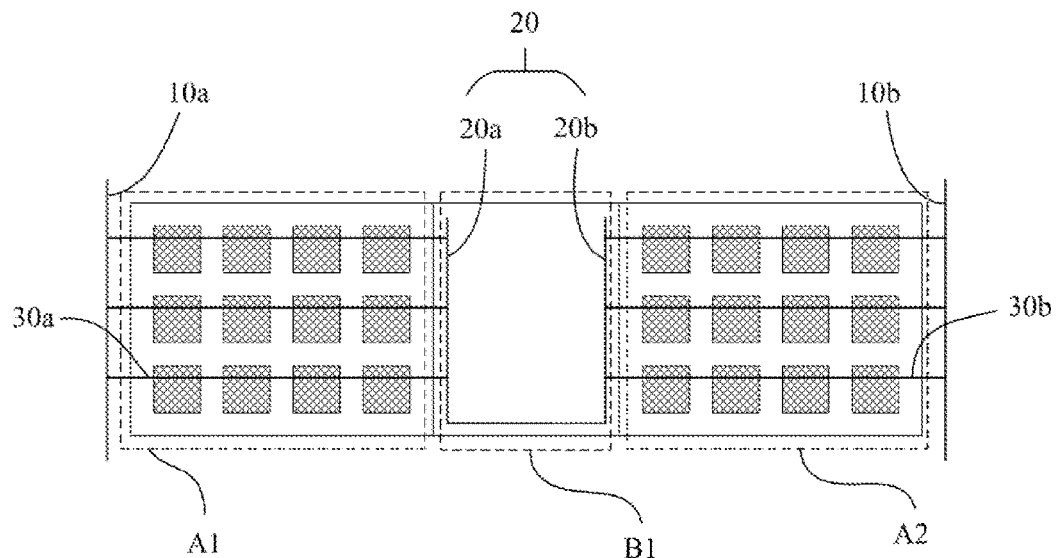
FIG. 6 is a structural schematic diagram of a display panel according to an embodiment of the present disclosure.
Figure 7:
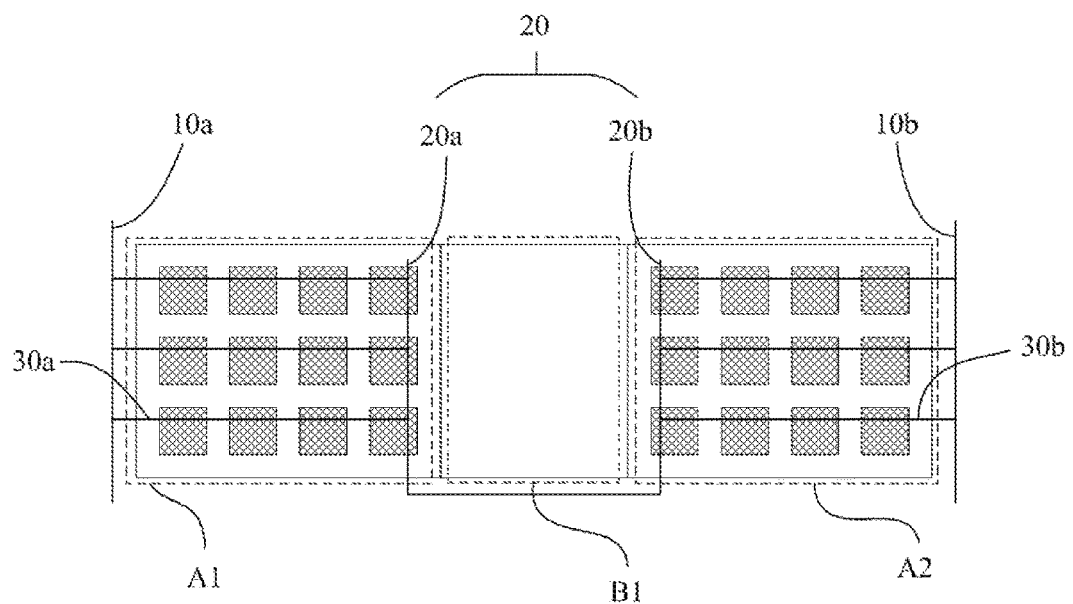
FIG. 7 is a structural schematic diagram of a display panel according to an embodiment of the present disclosure.

In one embodiment, in the display panel according to the embodiment of the present disclosure, the first conducting wire 20a and the second conducting wire 20b in the second signal bus line 20 can be of an integrated structure, as shown in FIG. 6 and FIG. 7, i.e., the first conducting wire 20a and the second conducting wire 20b are directly connected along edges of the intermediate area B1, so that a track of the second signal bus line 20 is of a U shape, and the first conducting wire 20a and the second conducting wire 20b can be manufactured by a one-time patterning process to simplify a fabrication process, and thus, not only is fabrication cost reduced, but also a sufficient electrical connection between the first conducting wire 20a and the second conducting wire 20b can also be ensured, which avoids the potential difference generated due to bad electrical contact of the first conducting wire 20a and the second conducting wire 20b and may be beneficial for implementing signal uniformity in the first display area A1 and the second display area A2.

Particularly, one end of the first signal line 30a is electrically connected with the first signal bus line 10a and the other end of the first signal line 30a is electrically connected with the first conducting wire 20a. One end of the second signal line 30b is electrically connected with the third signal bus line 10b and the other end of the second signal line 30b is electrically connected with the second conducting line 20b. In order to simplify the fabrication process, the first signal bus line 10a and the first conducting wire 20a can be set as an integrated structure, i.e., the first signal bus line 10a and the first conducting wire 20a can be fabricated and completed by a one-time patterning process, or the third signal bus line 10b and the second conducting wire 20b are set as an integrated structure, i.e., the third signal bus line 10b and the second wire 20b can be fabricated and completed by an one-time patterning process. And when the fabrication process is simplified, sufficient electrical contact between the first signal bus line 10a and the first conducting wire 20a or sufficient electrical contact between the third signal bus line 10b and the second conducting wire 20b is ensured so as to keep the potentials at both ends of the first signal line 30a and both ends of the second signal line 30b uniform. Therefore, in the display panel according to the embodiment of the present disclosure, as shown in FIG. 8 and FIG. 9, the first signal bus line 10a and the first conducting wire 20a are directly connected along the edge of the first display area A1; and/or, the third signal bus line 10b and the second conducting wire 20b are directly connected along the edge of the second display area A2.

Figure 8:
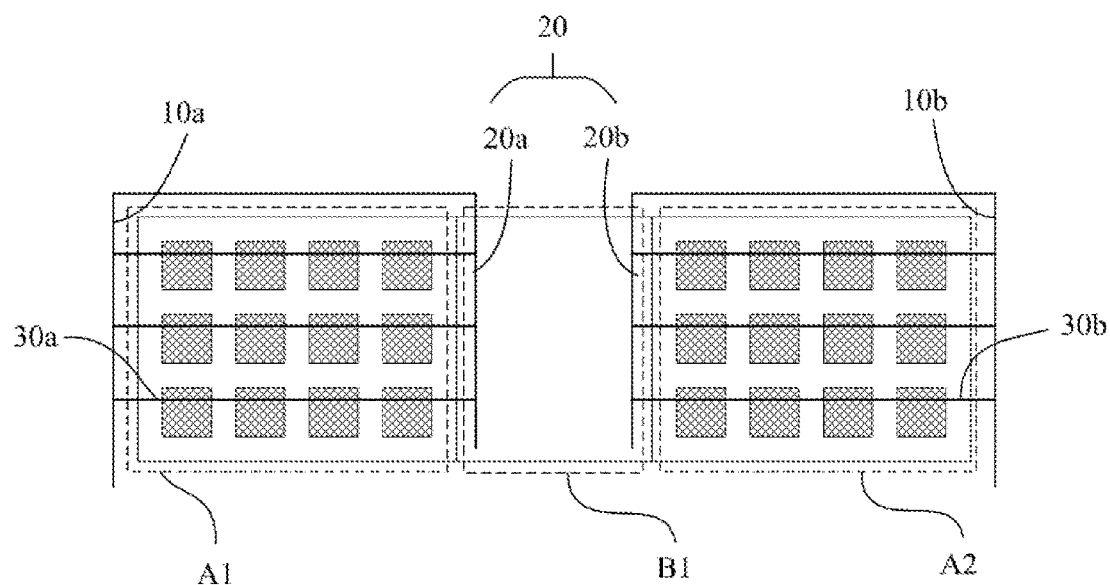
FIG. 8 is a structural schematic diagram of a display panel according to an embodiment of the present disclosure.
Figure 9:
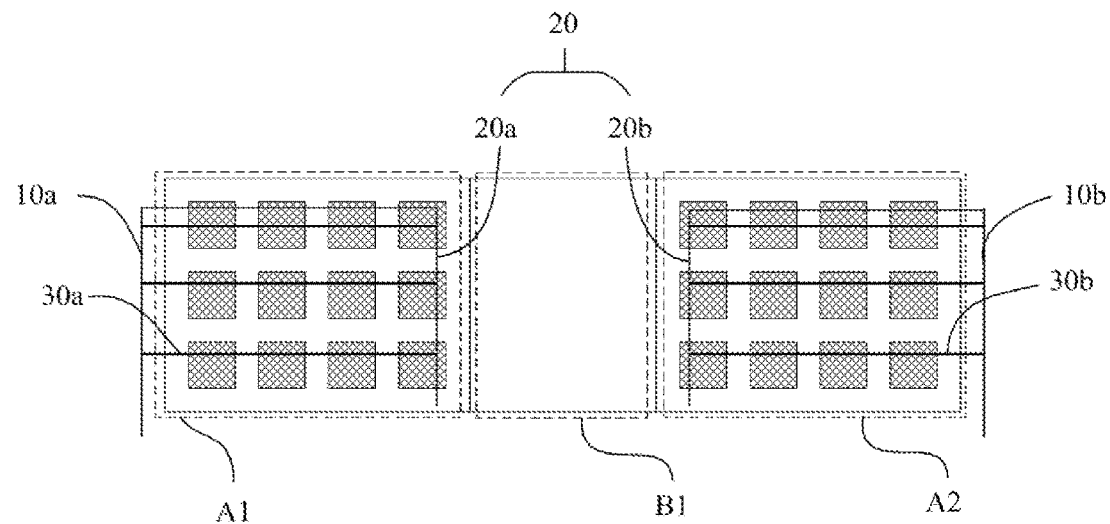
FIG. 9 is a structural schematic diagram of a display panel according to an embodiment of the present disclosure.
Figure 10:
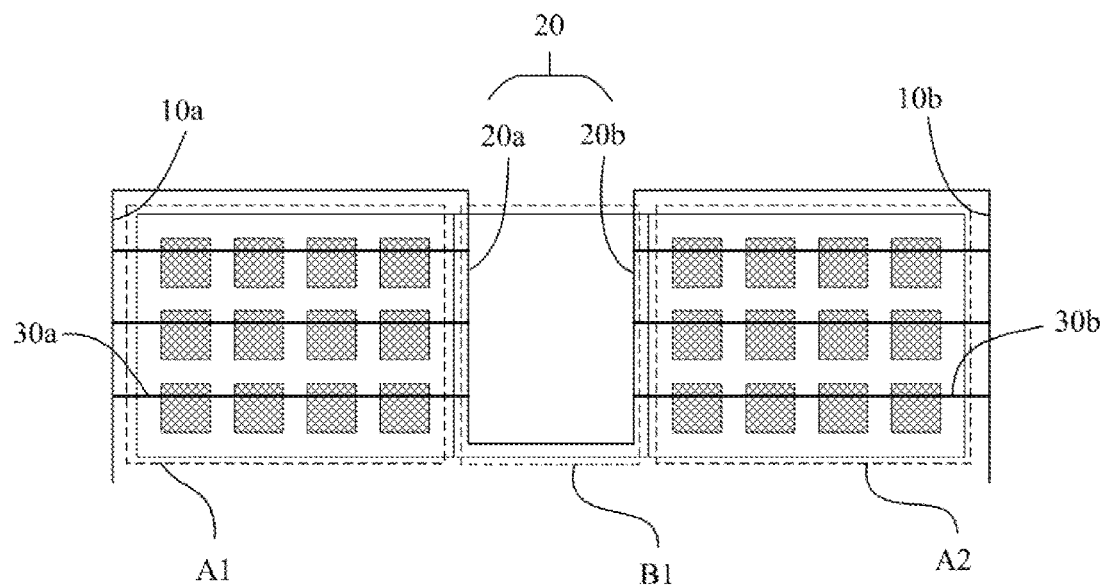
FIG. 10 is a structural schematic diagram of a display panel according to an embodiment of the present disclosure.
Figure 11:
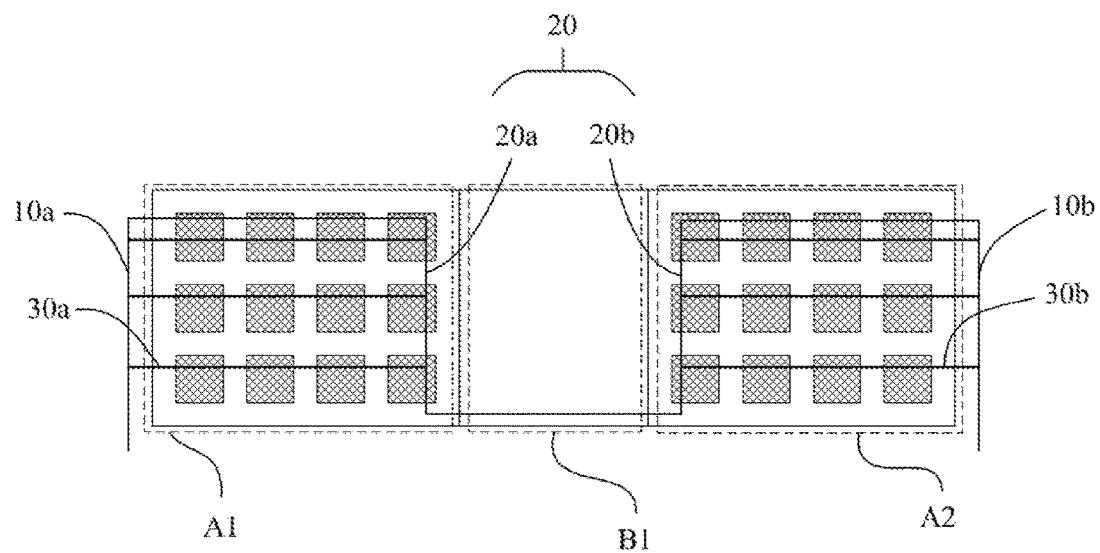
FIG. 11 is a structural schematic diagram of a display panel according to an embodiment of the present disclosure.

Moreover, based on the structures shown in FIG. 6 and FIG. 7, together with the structures in FIG. 8 and FIG. 9, the first signal bus line 10a, the second signal bus line 20 and the third signal bus line 10b can also be directly connected, as shown in FIG. 10 and FIG. 11, i.e., the first signal bus line 10a, the second signal bus line 20 and the third signal bus line 10b are set as an integrated structure, and the first signal bus line 10a, the second signal bus line 20 and the third signal bus line 10b are simultaneously fabricated by a one-time patterning process, so as to further simplify the fabrication process of the display panel and reduce fabrication cost.

In one embodiment, the second signal bus line 20 at least partially surrounds the edge of the intermediate area B1, and thus, when a specific position of the second signal bus line 20 is set, the second signal bus line 20 can be arranged in the intermediate area B1, as shown in FIG. 2, FIG. 4, FIG. 6, FIG. 8 and FIG. 10. Certainly, in order to occupy a border area as small as possible and implement a full screen with an ultra-narrow border, the second signal bus line 20 can also be arranged in the first display area A1 and the second display area A2, as shown in FIG. 3, FIG. 5, FIG. 7, FIG. 9 and FIG. 11.

In one embodiment, when the second signal bus line 20 is arranged in the intermediate area B1, as shown in FIG. 2, FIG. 4, FIG. 6, FIG. 8 and FIG. 10, in order to further simplify the fabrication process and reduce fabrication cost, the second signal bus line 20 can be fabricated simultaneously with a certain film layer in thin film transistors arranged in the first display area A1 and the second display area A2.

Particularly, no matter whether the display panel is a liquid crystal display panel or an electroluminescent display panel, the thin film transistor is also arranged in the first display area A1 and/or the second display area A2; and the thin film transistor is used for driving the display panel to emit light. Particularly, when the display panel is the liquid crystal display panel, a drain electrode of the thin film transistor in the display area is electrically connected with a pixel electrode through a via hole, a voltage is provided to the pixel electrode through the thin film transistor, and then by an electric field formed between the voltage and a common voltage on a common electrode, liquid crystal molecules are driven to deflect to control emission or shielding of light so as to achieve a display function. And when the display panel is the electroluminescent display panel, at least two thin film transistors are arranged in a pixel control circuit in the display area and include switching transistors and driving transistors. Generally, a drain electrode of the driving transistor is electrically connected with an anode in a light emitting unit through a via hole for providing a voltage for the anode so as to inject into holes. Electrons are injected by loading a voltage to a cathode in the light emitting unit, and light emission is activated by a combination of holes and the electrons in the light emitting layer so as to achieve the display function. Therefore, regardless of the liquid crystal display panel or the electroluminescent display panel, arrangement of a thin film transistor may be very important, so in the display panel according to the embodiment of the present disclosure, the position of the second signal bus line 30b including the first conducting wire 20a and the second conducting wire 20b can be specially set according to positions of film layers of a gate electrode and/or of a source/drain electrode in the thin film transistor.

Figure 12A:
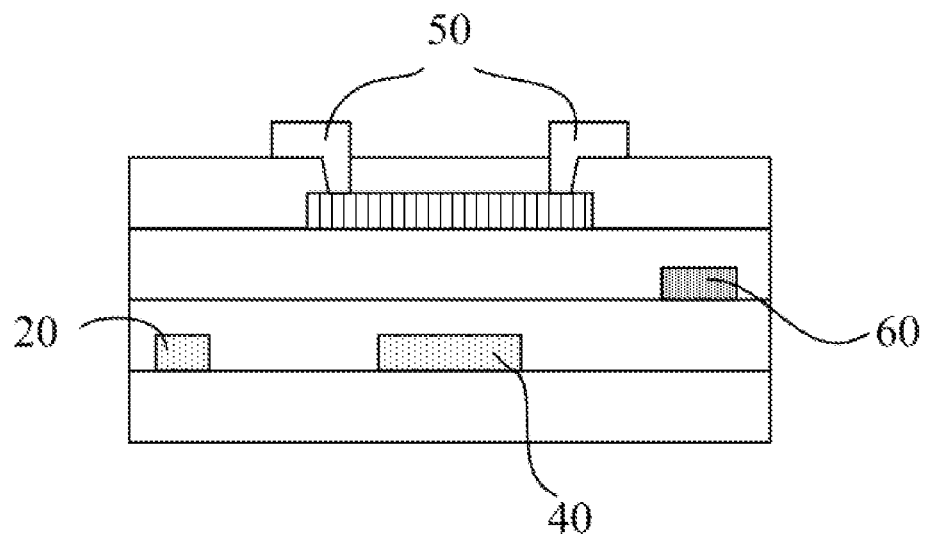
FIG. 12A is a structural schematic diagram of a bottom-gate type thin film transistor according to an embodiment of the present disclosure.
Figure 12B:
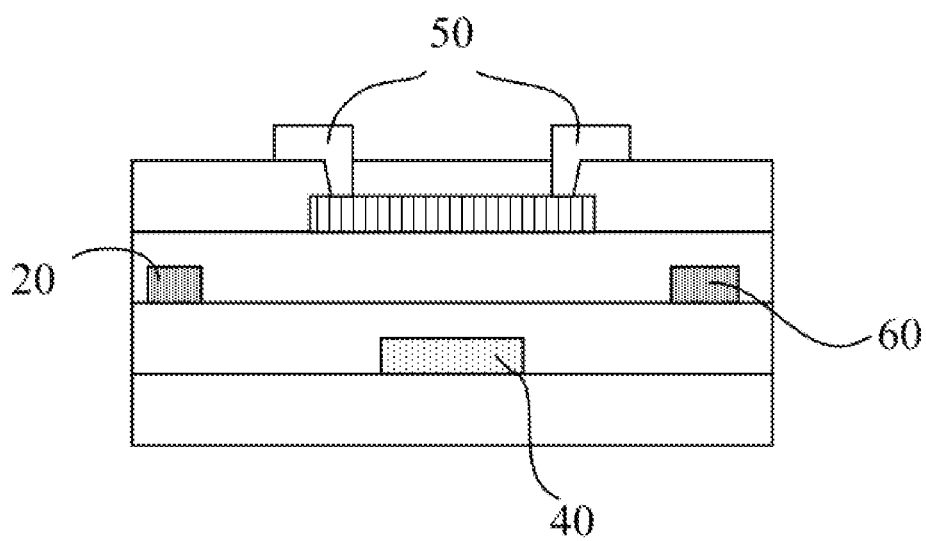
FIG. 12B is a structural schematic diagram of a bottom-gate type thin film transistor according to an embodiment of the present disclosure.
Figure 13A:
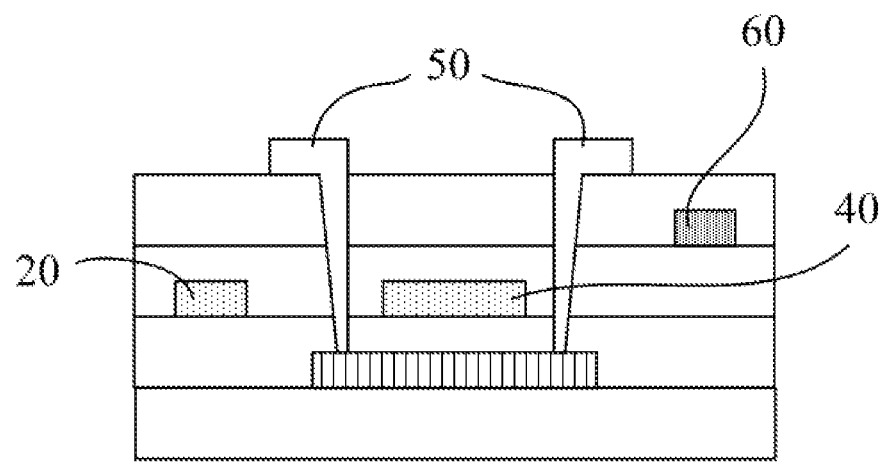
FIG. 13A is a structural schematic diagram of a top-gate type thin film transistor according to an embodiment of the present disclosure.
Figure 13B:
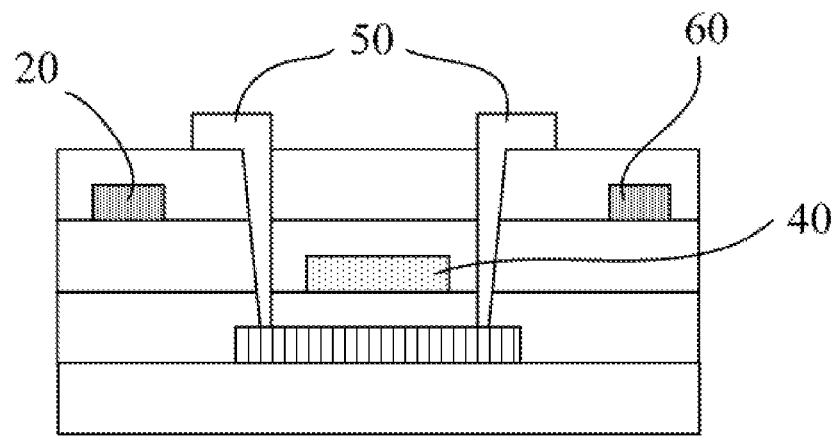
FIG. 13B is a structural schematic diagram of a top-gate type thin film transistor according to an embodiment of the present disclosure.

Particularly, in the display panel according to the embodiment of the present disclosure, as shown in FIG. 12A and FIG. 13A, the second signal bus line 20 and the gate electrode 40 of the thin film transistor are made of the same material and are arranged on the same layer, i.e., the second signal bus line 20 and the gate electrode 40 in the thin film transistor are fabricated and completed through a one-time patterning process, so as to simplify the fabrication process. Or, the second signal bus line 20 can also be made of the same material and arranged on the same layer as a metal electrode 60 positioned between the gate electrode 40 and the source/drain electrode 50 of the thin film transistor, as shown in FIG. 12B and FIG. 13B, i.e., the second signal bus line 20 and the metal electrode 60 are fabricated and completed through a one-time patterning process, so as to simplify the fabrication process.

Figure 12C:
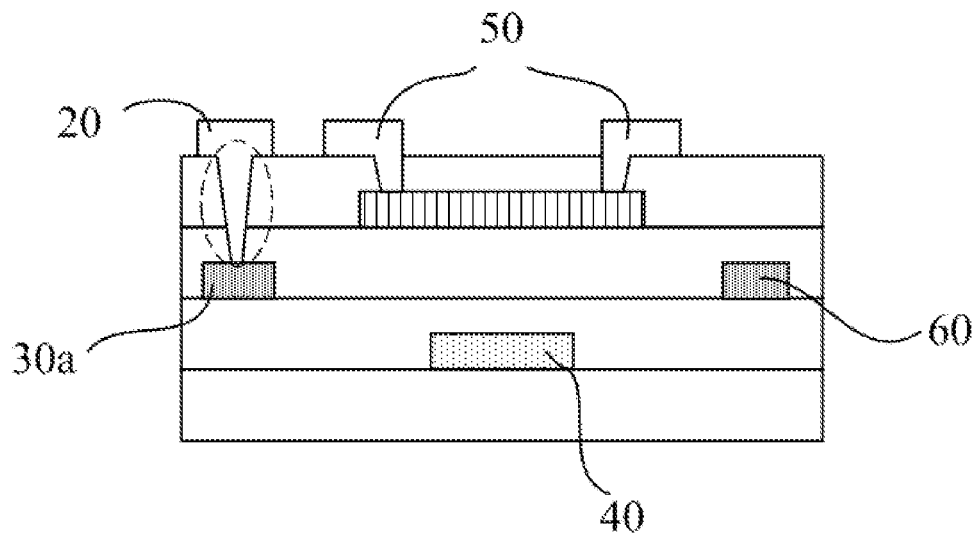
FIG. 12C is a structural schematic diagram of a bottom-gate type thin film transistor according to an embodiment of the present disclosure.
Figure 13C:
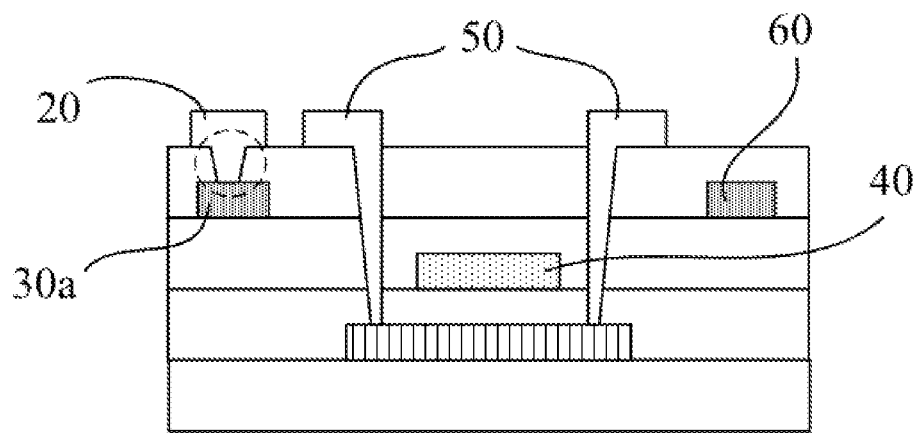
FIG. 13C is a structural schematic diagram of a top-gate type thin film transistor according to an embodiment of the present disclosure.

Particularly, the second signal bus line 20 is used for electrically connecting the first signal line 30a in the first display area A1 with the second signal line 30b in the second display area A2 so as to ensure that the first signal line 30a and the second signal line 30b have the same potential, and thus resistivity of the second signal line 20 may need to be as low as possible to reduce attenuation of the voltage in the second signal bus line 20 to the greatest extent. Also, in the thin film transistor, due to limitation of the structure of the display panel and functions of each part, metal materials for fabricating the source/drain electrode 50, the metal electrode 60 and the gate electrode 40 are different, therefore resistivity of the source/drain electrode 50, the metal electrode 60 and the gate electrode 40 is also different. Generally, the source/drain electrode 50 can be made of a metal material with low resistivity. So in the display panel according to the embodiment of the present disclosure, as shown in FIG. 12C and FIG. 13C, the second signal bus line 20 can also be made of the same material and arranged on the same layer with the source/drain electrode 50 of the thin film transistor, i.e., the second signal bus line 20 and the source/drain electrode 50 are fabricated and completed through a one-time patterning process, so that not only can the fabrication process be simplified, but also the first signal line 30a and the second signal line 30b can be guaranteed to have the same potential, and display uniformity of the first display area A1 and the second display area A2 is implemented.

In one embodiment, in the display panel according to the embodiment of the present disclosure, a square resistance of the source/drain electrode 50 is set within a range of 0.05 ohm to 0.1 ohm.

Moreover, when the second signal bus line 20 and the source/drain electrode 50 of the thin film transistor are made of the same material and arranged on the same layer, the first signal line 30a may be a reference signal line or a power supply voltage signal line, and the reference signal line or the power supply voltage signal line is generally arranged on the same layer with the metal electrode 60. Thus in the display panel according to the embodiment of the present disclosure, as shown in FIG. 12C and FIG. 13C, since the first conducting wire 20a is one portion of the second signal bus line 20, a position of the second signal bus line 20 can be considered as a position of the first conducting wire 20a, and the first conducting wire 20a in the second signal bus line 20 is electrically connected with the first signal line 30a through a via hole. Moreover, the first signal line 30a and the second signal line 30b generally have the same potential, and thus, a set position of the second signal line 30b is generally the same as that of the first signal line 30a, so that the second conducting wire 20b and the second signal line 30b are also electrically connected through a via hole (as shown in dotted line circles in FIG. 12C and FIG. 13C).

It should be noted that a thin film transistor can be a top-gate type thin film transistor or a bottom-gate type thin film transistor. The gate electrode 40 of the bottom-gate type thin film transistor is positioned on one side (as shown in FIG. 12A to FIG. 12C) of an active layer away from the source/drain electrode 50, and the gate electrode 40 of the top-gate type thin film transistor is positioned between the active layer and the source/drain electrode 50 (as shown in FIG. 13A to FIG. 13C). Therefore, regardless of the top-gate type thin film transistor or the bottom-gate type thin film transistor, the second signal bus line 20 can be fabricated simultaneously with the gate electrode 40, the source/drain electrode 50 or the metal electrode 60 so as to simplify the fabrication process and reduce fabrication cost.

In addition, it should be noted that a specific position of the metal electrode 60 in a film layer between the gate electrode 40 and the source/drain electrode 50 is not limited to positions as shown in FIG. 12A to FIG. 12C and FIG. 13A to FIG. 13C, and the specific position of the metal electrode 60 in the film layer between the gate electrode 40 and the source/drain electrode 50 may need to be set according to effects and specific demands of the metal electrode 60 so as to avoid interference to other electrodes or structures, thereby ensuring normal display of the display panel.

Figure 14:
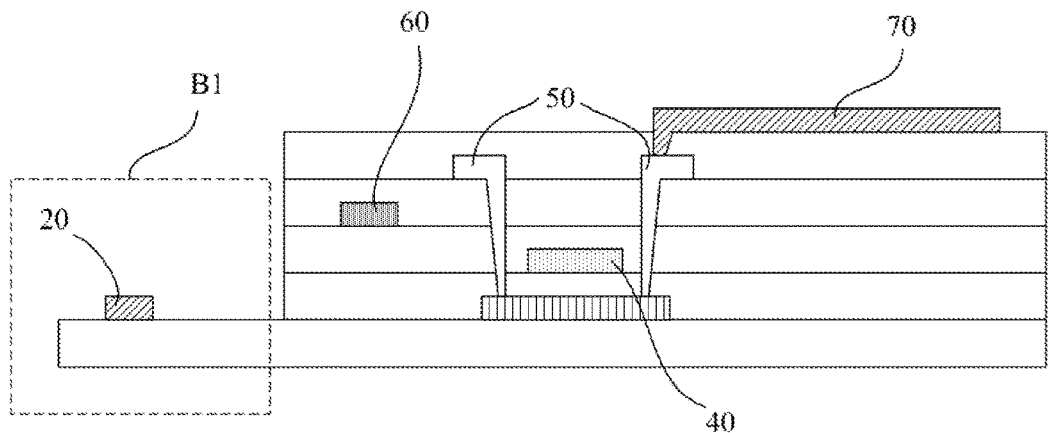
FIG. 14 is a position relationship schematic diagram of a second signal bus line according to an embodiment of the present disclosure.

In one embodiment, when the second signal bus line 20 is arranged in the intermediate area B1, as shown in FIG. 2, FIG. 4, FIG. 6, FIG. 8 and FIG. 10, in the display panel according to the embodiment of the present disclosure, when the display panel is an electroluminescent display panel, anodes are also arranged in both the first display area A1 and the second display area A2. Therefore, as shown in FIG. 14, which takes it as an example that the thin film transistor is a top-gate type thin film transistor, the second signal bus line 20 can be made of the same material and arranged on the same layer as the anode 70, i.e., the second signal bus line 20 and the anode 70 are fabricated and completed through a one-time patterning process. In FIG. 14, a block representing the second signal bus line 20 and a block representing the anode 70 have a same filling pattern, which represents that the second signal bus line 20 and the anode 70 are simultaneously fabricated, so as to simplify the fabrication process and reduce fabrication cost.

Figure 15:
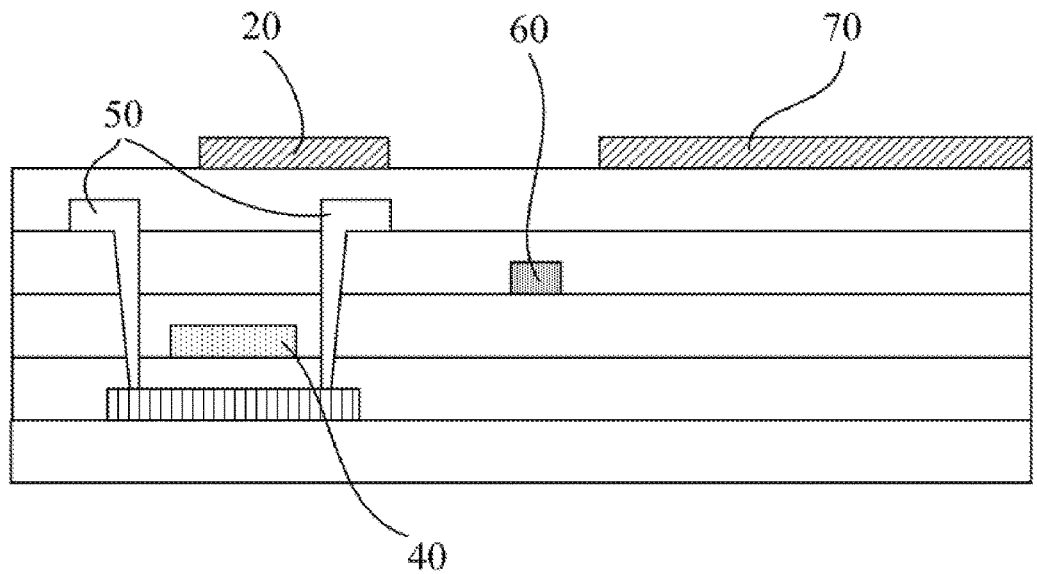
FIG. 15 is a position relationship schematic diagram of a second signal bus line according to an embodiment of the present disclosure.

In one embodiment, when the second signal bus line 20 is arranged in the first display area A1 and the second display area A2, in the display panel according to the embodiment of the present disclosure, as shown in FIG. 3, FIG. 5, FIG. 7, FIG. 9 and FIG. 11, at least two virtual pixel units are arranged at both the edge in the first display area A1 and the edge in the second display area A2. As shown in FIG. 15, the thin film transistor in FIG. 15 is illustrated by taking the top-gate type thin film transistor as an example, and the second signal bus line 20 is arranged in an area where the virtual pixel units are positioned so as to reduce an occupation area of the border area to the greatest extent and benefit for implementing design of the full screen.

Particularly, when the display panel is an electroluminescent display panel, in the display panel according to the embodiment of the present disclosure, as shown in FIG. 15, the anode 70 is arranged in the area where the virtual pixel units are positioned. The second signal bus line 20 can be made of the same material and arranged on the same layer with the anode 70, i.e., the second signal bus line 20 and the anode 70 in the area where the virtual pixel units are positioned are fabricated and completed through a one-time patterning process, so as to fulfill the aims of simplifying the fabrication process and reducing fabrication cost. And moreover, arrangement of the second signal bus line 20 in the area where the virtual pixel units are positioned may also be beneficial for implementing narrow border design of the display panel.

In addition, both a pixel control circuit and a light emitting unit are arranged in a virtual pixel unit, and structures of the pixel control circuit and the light emitting unit are the same in setting with those in a normal pixel unit (a pixel unit for display), except that in the virtual pixel unit, the pixel control circuit is not electrically connected with the light emitting unit, the pixel control circuit and the light emitting unit are independent of each other and have no connection relationship, so that the virtual pixel unit cannot emit light. Therefore, an anode in a virtual pixel unit can be utilized, i.e., anodes arranged in each virtual pixel unit can be electrically connected to form the second signal bus line 20, which may be beneficial for further simplifying the fabrication process and reducing fabrication cost. Certainly, in a virtual pixel unit, it is possible not to fabricate an anode, and then the second signal bus line 20 can be arranged at the position of the anode so as to simplify the structure of the display panel and avoid a short circuit caused by complex wiring.

In one embodiment, when the display panel is an electroluminescent display panel, the first signal line 30a and the second signal line 30b can be reference signal lines or power supply voltage signal lines for providing reference signals or power voltage signals to each pixel unit in the electroluminescent display panel so as to contribute to achieve the display function of the electroluminescent display panel.

In one embodiment, in the display panel according to the embodiment of the present disclosure, the display panel is the electroluminescent display panel; the first signal line 30a and/or the second signal line 30b is a reference signal line; and the reference signal line is used for inputting an initialization signal for the electroluminescent display panel.

Particularly, when the first signal line 30a is a reference signal line and/or the second signal line 30b is a reference signal line, the reference signal line can be made of a same material and arranged on a same layer as an anode in a pixel unit, and can also be made of a same material and arranged on a same layer as the metal electrode 60. Certainly, the reference signal line provides a reference signal to each pixel unit in the first display area A1 and the second display area A2, so the reference signal line is generally set to be long. Due to internal resistance, attenuation of the reference signal may be caused so as to generate a voltage drop which influences display quality of display pictures. Therefore, in order to reduce the voltage drop, in the display panel according to the embodiment of the present disclosure, the reference signal line generally includes a first metal line and a second metal line which are arranged on different layers and extend along a same direction; the first metal line is electrically connected with the second metal line through a via hole. Moreover, since the reference signal generally has a negative potential and has a small voltage drop, the reference signal generally is an initialization signal of a pixel control circuit in the electroluminescent display panel, and luminous brightness of a light emitting unit in the electroluminescent display panel is generally unrelated to the potential of the reference signal, so the number of via holes can be reduced, i.e., the via holes are formed at edges of the first display area A1 and the second display area A2, so as to reduce structural complexity of the electroluminescent display panel.

Particularly, when a first metal line and a second metal line both constituting a reference signal line are arranged on different layers, the first metal line can be made of a same material and arranged on a same layer as an anode in a pixel unit, and the second metal line can be made of a same material and arranged on a same layer with the metal electrode 60. Certainly, the first metal line can also be made of a same material and arranged on a same layer with the metal electrode 60, and the second metal line can also be made of a same material and arranged on a same layer as an anode in a pixel unit, which are not limited herein. By setting the reference signal line into a different-layer structure and electrically connecting edges of the first display area A1 and the second display areas A2 through the via hole, the voltage drop of the reference signal line can be effectively reduced.

In addition, an extension direction of the first metal line and the second metal line can be along a row direction of the pixel units, or can also be along a column direction of the pixel unit, but in order to avoid generating serious influence on other structures and facilitate fabrication, the extension direction of the first metal line and the second metal line is generally set to be along the row direction of the pixel units.

Moreover, in the display panel according to the embodiment of the present disclosure, the reference signal line and the first signal bus line 10a are set to have different electrical resistivity, i.e., the reference signal line is made of a material different from the material the first signal bus line 10a is made of, and thus, the reference signal line and the first signal bus line 10a are positioned on different film layers.

In one embodiment, in the display panel according to the embodiment of the present disclosure, when the display panel is an electroluminescent display panel, the first signal line 30a and/or the second signal line 30b is a power supply voltage signal line, such as a PVDD signal line; and a power supply voltage signal line is configured to drive the electroluminescent display panel to emit light.

Particularly, when the first signal line 30a is a power supply voltage signal line and/or the second signal line 30b is a power supply voltage signal line, the power supply voltage signal line can be made of a same material and arranged on a same layer as the source/drain electrode 50 in the thin film transistor, and can also be made of a same material and arranged on a same layer with the metal electrode 60. Certainly, since a power supply voltage signal line provides a power supply voltage signal to each pixel unit in the first display area A1 and in the second display area A2, the power supply voltage signal line is generally set to be long. Due to internal resistance attenuation of the power supply voltage signal may be caused and a voltage drop is generated, influencing display quality of the display pictures. Therefore, in order to reduce the voltage drop, in the display panel according to the embodiment of the present disclosure, the power supply voltage signal line generally includes a third metal line and a fourth metal line which are arranged on different layers and extend along different directions. The third metal line is electrically connected with the fourth metal line through a via hole. Moreover, a potential of the power supply voltage signal generally is +5V, the power supply voltage signal has a large voltage drop, and the power supply voltage signal generally is related to luminous brightness of a light emitting unit in the electroluminescent display panel, so the voltage drop of a power voltage may need to be strictly controlled. As a result, generally, the via hole is formed in each pixel unit to implement electrical connection of the third metal line and the fourth metal line for reducing the voltage drop.

Particularly, when the third metal line and the fourth metal line which constitute the power supply voltage signal line are arranged on different layers, the third metal line can be made of a same material and arranged on a same layer as the source/drain electrode 50 of the thin film transistor, and the fourth metal line can be made of a same material and arranged on a same layer with the metal electrode 60. Certainly, the third metal line can also be made of a same material and arranged on a same layer as the metal electrode 60, and the fourth metal line can also be made of a same material and arranged on a same layer with the source/drain electrode 50 of the thin film transistor, which are not limited herein.

Moreover, when the third metal line is made of the same material and arranged on the same layer with the source/drain electrode 50 in the thin film transistor and the fourth metal line is made of the same material and arranged on the same layer with the metal electrode 60, since one of the metal lines which constitute the reference signal line is made of the same material and arranged on the same layer with the metal electrode 60 and extends along the row direction of the pixel unit, in order to avoid bad influence on the potential, which is caused by a short circuit between the power supply voltage signal and the reference signal, the third metal line is also set to extend along the row direction of the pixel unit. For the fourth metal line, since the fourth metal line is made of the same material and arranged on the same layer with the source/drain electrode 50 in the thin film transistor and a data signal line electrically connected with the source electrode generally extends along the column direction of the pixel unit, in order not to generate interference to the data signal line, the fourth metal line may need to be set to extend along the column direction of the pixel unit.

In addition, when the third metal line and the source/drain electrode 50 in the thin film transistor are made of the same material and arranged on the same layer and the fourth metal line and the metal electrode 60 are made of the same material and arranged on the same layer, the fourth metal line and the gate electrode 40 in the thin film transistor form a storage capacitor for storing a data signal so as to implement continuous light emission of the light emitting unit within display time of one frame.

In one embodiment, besides the first display area A1, the second display area A2 and the intermediate area B1, the display panel further includes a third display area, where the first display area A1, the second display area A2 and the intermediate area B1 are generally arranged at the top of the display panel and only occupy a few positions in the display panel, but the third display area occupies most positions of the display panel and is a main display area of the display panel, and by coordination of three display areas, the display function of the display panel is achieved. Therefore, in the display panel according to the embodiment of the present disclosure, in connection with the structural schematic diagram shown in FIG. 10, the structural schematic diagram when the display panel includes the third display area A3 is as shown in FIG. 16, and the display panel further includes the third display area A3; and the first display area A1, the second display area A2 and the intermediate area B1 are all arranged at a same side edge of the third display area A3.

Particularly, both the first display area A1 and the second display area A2 are arranged at the top of the display panel and the third display area A3 is the main display area of the display panel, and thus, the first display area A1 and the second display area A2 can be configured to only display time, reminder icon and the like, and the third display area A3 is configured to display an image. Therefore, in the display panel according to the embodiment of the present disclosure, the first display area A1 and the second display area A2 may need to be controlled respectively independent of the third display area A3, i.e., two sets of control systems are arranged in the display panel, one set of control system is configured to control display images of the first display area A1 and the second display area A2, and the other set of control system is configured to control display images of the third display area A3.

Certainly, it is also possible that only one set of control system is arranged to control the display images of three display areas, and by different algorithm and module settings, separated display of the images is implemented.

Figure 16:
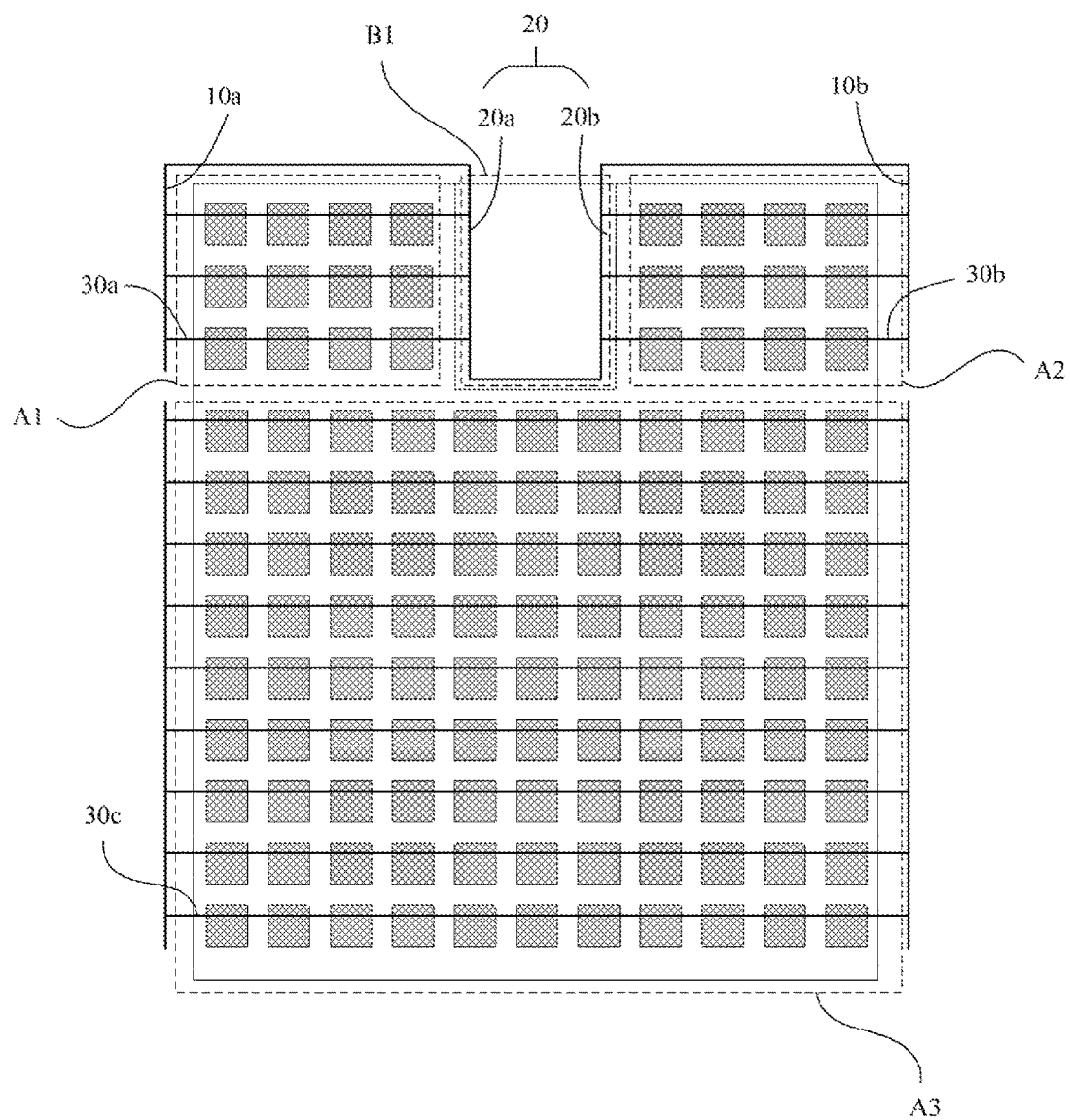
FIG. 16 is a structural schematic diagram of another display panel according to an embodiment of the present disclosure.

Moreover, in order to achieve the display function of the third display area A3, in the display panel according to the embodiment of the present disclosure, as shown in FIG. 16, a third signal line 30c is arranged in the third display area A3; and the first signal line 30a and the second signal line 30b have voltage signals different from a voltage signal the third signal line 30c has, respectively, so as to implement independent control between the first display area A1 and the third display area A3. And between the second display area A2 and the third display area A3.

Figure 17:
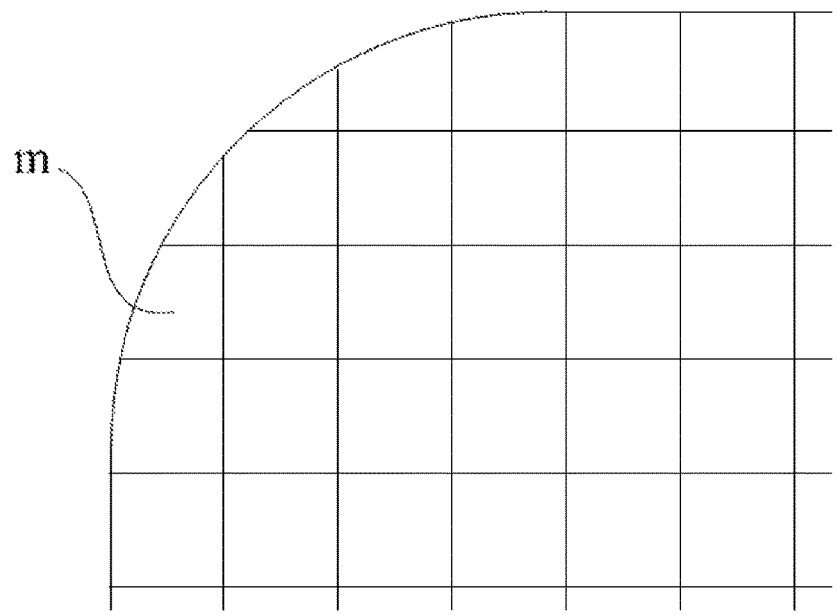
FIG. 17 is a local structural schematic diagram of a display panel according to an embodiment of the present disclosure.

Moreover, for an existing display device such as a mobile phone, in order to reduce the size of the area occupied by the border and increase the ratio of the display area to the greatest extent, a corner of the display panel can be set as arc to facilitate the ultra-narrow border design, i.e., to obtain a full screen. Therefore, in order to fabricate the display panel of which the corner is an arc, in the display panel according to the embodiment of the present disclosure, the first display area A1, the second display area A2 and the third display area A3 each include at least two pixel units m arranged in an array. And as shown in the local schematic diagram of the display panel in FIG. 17, the numbers of at least two rows of pixel units m are set to be different.

In another aspect, in the structure shown in FIG. 1, the non-display area B can be reserved on the display panel, or certainly, the non-display area B can also be cut off, i.e., the non-display area B is a hollow area, so that the full screen has a hollow structure. And moreover, due to arrangement of the non-display area B, electrical connection between the signal line arranged in the first display area A1 and the signal line arranged in the second display area A2 cannot be implemented, which causes differences between the signals in the two display areas and the display effect of the integral display panel is influenced.

Therefore, an embodiment of the present disclosure further provides an electroluminescent display panel for solving a problem of differences between signals in the first display area A1 and in the second display area A2 and improving uniformity of the signals in two display areas so as to improve a display effect of the display pictures.

Figure 18:
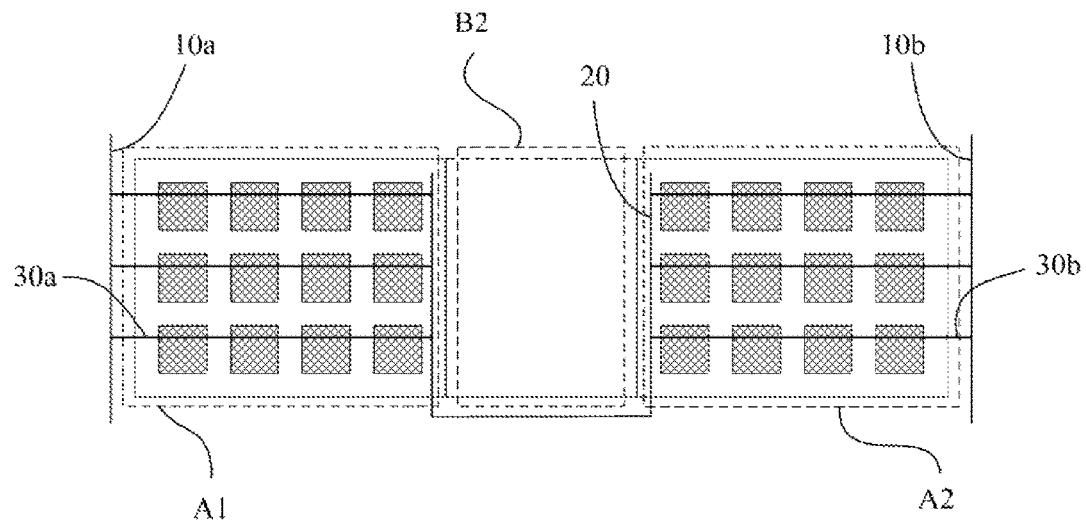
FIG. 18 is a structural schematic diagram of an electroluminescent display panel according to an embodiment of the present disclosure.

Particularly, the electroluminescent display panel according to the embodiment of the present disclosure, as shown in FIG. 18, can include a first display area A1, a second display area A2 and a hollow area B2 arranged between the first display area A1 and the second display area A2.

The electroluminescent display panel further includes a first signal bus line 10a, a second signal bus line 20 and a third signal bus line 10b.

The first signal bus line 10a at least partially surrounds an edge of the first display area A1 farthest away from the hollow area B2.

The second signal bus line 20 at least partially surrounds an edge of the hollow area B2 closest to the first display area A1 and the second display area A2.

The third signal bus line 10b at least partially surrounds an edge of the second display area A2 away from the hollow area B2.

A first signal line 30a is arranged in the first display area A1. One end of the first signal line 30a is electrically connected to the first signal bus line 10a, and the other end of the first signal line 30a is electrically connected to the second signal bus line 20.

A second signal line 30b is arranged in the second display area A2. One end of the second signal line 30b is electrically connected with the second signal bus line 20, and the other end of the second signal line 30b is electrically connected with the third signal bus line 10b.

According to the electroluminescent display panel according to the embodiment of the present disclosure, by arrangement of the second signal bus line 20, electrical connection of the first signal line 30a positioned in the first display area A1 and the second signal line 30b positioned in the second display area A2 can be implemented, i.e., the first signal line 30a and the second signal line 30b are guaranteed to have the same potential, so as to effectively solve the existing problem of signal non-uniformity in the display areas on both sides of the hollow area B2, ensure signal uniformity of the first display area A1 and the second display area A2 and facilitate improvement of the display effect of the electroluminescent display panel having the hollow structure, thereby improving the visual experience of a viewer.

In one embodiment, in order to simplify a fabrication process and reduce fabrication cost, in the electroluminescent display panel according to the embodiment of the present disclosure, the first signal bus line 10a, the second signal bus line 20 and the third signal bus line 10b are made of the same material and arranged on the same layer, i.e., the first signal bus line 10a, the second signal bus line 20 and the third signal bus line 10b can be fabricated and completed through a one-time patterning process. Moreover, the first signal line 30a is respectively connected with the second signal bus line 20 and the first signal bus line 10a through via holes, and the second signal line 30b is respectively connected with the second signal bus line 20 and the third signal bus line 10b through via holes, which may be beneficial for implementing uniformity of potentials of signals input by the first signal line 30a and by the second signal line 30b and improving the display effect of display pictures.

Particularly, in order to achieve a display function of the electroluminescent display panel, an initialization signal may need to be input for a pixel control circuit in the electroluminescent display panel, and thus, in the electroluminescent display panel according to the embodiment of the present disclosure, the first signal line 30a and the second signal line 30b are reference signal lines, configured to input the initialization signal for the electroluminescent display panel.

Particularly, in order to achieve the display function of the electroluminescent display panel, a power supply voltage signal also may need to be input for the pixel control circuit in the electroluminescent display panel, and thus, in the electroluminescent display panel according to the embodiment of the present disclosure, the first signal line 30a and the second signal line 30b are power supply voltage signal lines, configured to drive the electroluminescent display panel to emit light.

In one embodiment, besides the first display area A1, the second display area A2 and the hollow area B2, the electroluminescent display panel further includes a third display area, where the first display area A1, the second display area A2 and the hollow area B2 are generally arranged at the top of the electroluminescent display panel and only occupy a few positions in the electroluminescent display panel, but the third display area occupies most positions of the display panel and is a main display area of the electroluminescent display panel, and by coordination of three display areas, the display function of the electroluminescent display panel is achieved. Therefore, in the electroluminescent display panel according to the embodiment of the present disclosure, as shown in FIG. 19, the electroluminescent display panel further can include the third display area A3 arranged on a same side of the first display area A1 and of the second display area A2.

Particularly, both the first display area A1 and the second display area A2 are arranged at the top of the display panel and the third display area A3 is the main display area of the display panel, and thus, the first display area A1 and the second display area A2 can be configured to only display time, a reminder icon and the like, and the third display area A3 is configured to displaying an image. Therefore, in the electroluminescent display panel according to the embodiment of the present disclosure, the first display area A1 and the second display area A2 may need to be controlled respectively independent of the third display area A3, i.e., two sets of control systems are arranged in the display panel, one set of control system is configured to control display images of the first display area A1 and the second display area A2, and the other set of control system is configured to control a display image of the third display area A3.

Certainly, it is also possible that only one set of control system is arranged to control three display areas, and by different algorithm and module settings, separated display of the images is implemented.

Figure 19:
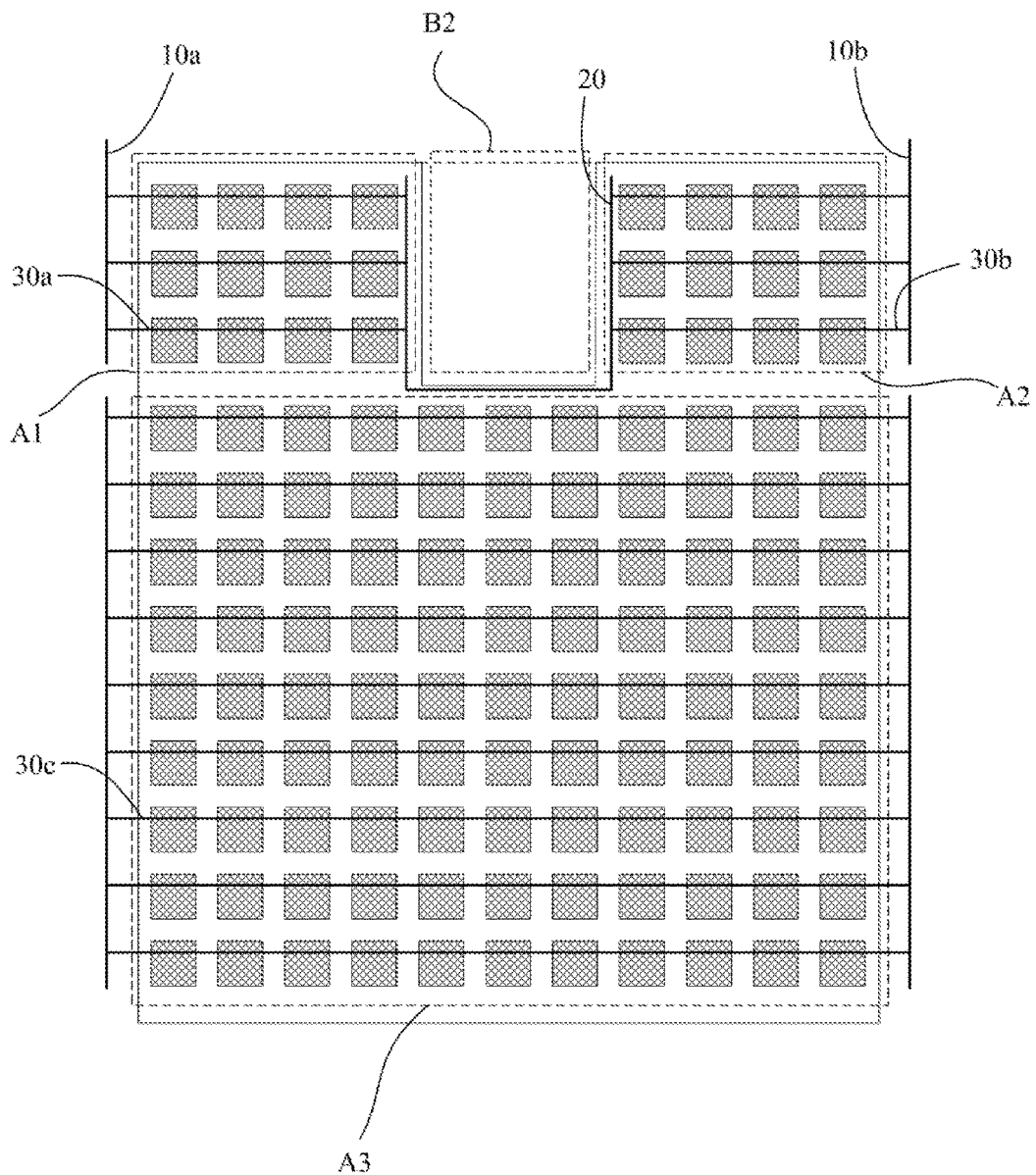
FIG. 19 is a structural schematic diagram of an electroluminescent display panel according to an embodiment of the present disclosure.

Moreover, in order to achieve the display function of the third display area A3, in the electroluminescent display panel according to the embodiment of the present disclosure, as shown in FIG. 19, a third signal line 30c is arranged in the third display area A3; the first signal line 30a and the second signal line 30b have voltage signals different from a voltage signal the third signal line 30c has, respectively, so as to implement independent control between the first display area A1 and the third display area A3, and between the second display area A2 and the third display area A3.

Figure 20:
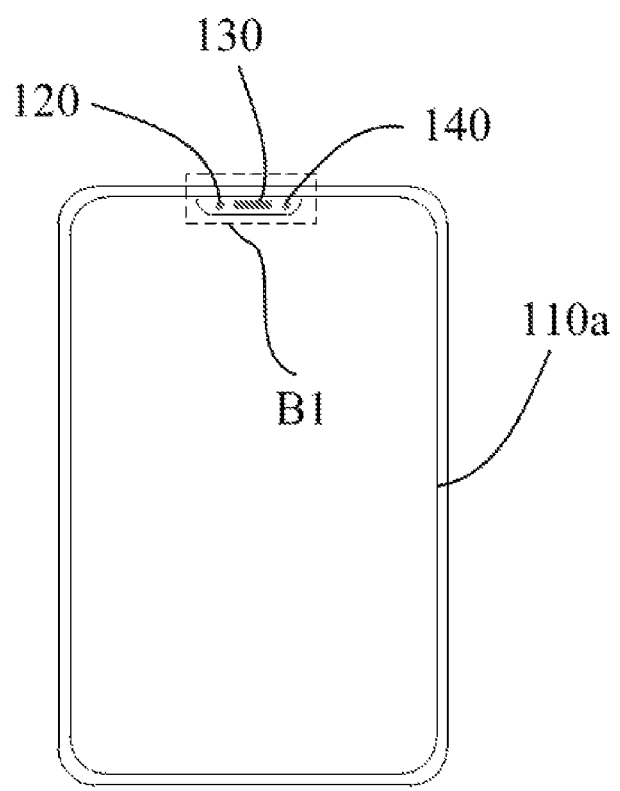
FIG. 20 is a structural schematic diagram of a display device according to an embodiment of the present disclosure.
Figure 21:
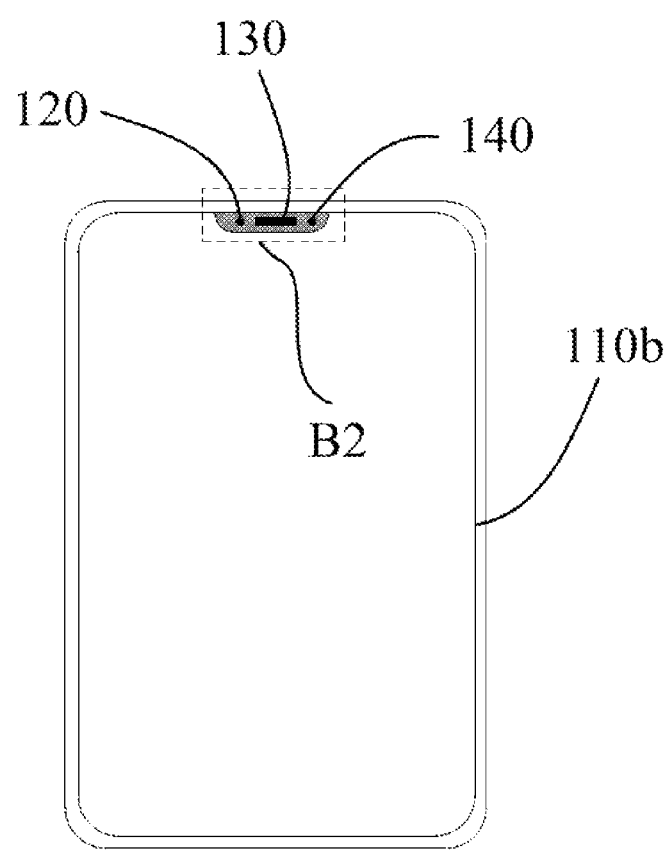
FIG. 21 is a structural schematic diagram of a display device according to an embodiment of the present disclosure.

Based on the same inventive concept, an embodiment of the present disclosure further provides a display device, which can include the display panel 110a according to the embodiment of the present disclosure, or the electroluminescent display panel 110b according to the embodiment of the present disclosure. The display device may be any product or component with a display function such as a mobile phone (as shown in FIG. 20 and FIG. 21), a tablet computer, a television, a display, a notebook computer, a digital photo frame or a navigator. Implementation of the display device can refer to the embodiment of the electroluminescent display panel, which is not repeated herein.

In one embodiment, in order to enable the display device to have a camera function, in the display device according to the embodiment of the present disclosure, as shown in FIG. 20 and FIG. 21, the display device can further include an image acquisition structure 120. Moreover, the image acquisition structure 120 is arranged in the intermediate area B1 (shown as a dotted line frame in FIG. 20) of the display panel 110a and generally is arranged on a non-light emergent side of the display panel 110a, or, the image acquisition structure 120 is arranged in the hollow area B2 (shown as a dotted line frame in FIG. 21) of the electroluminescent display panel 110b.

Particularly, in order to increase application functions of the display device, in the display device according to the embodiment of the present disclosure, in the intermediate area B1 of the display panel or in the hollow area B2 of the electroluminescent display panel, the display device can further include one or a combination of a phone receiver, a light sensor, a distance sensor, an iris recognition sensor and a fingerprint recognition sensor. Particularly, as shown in FIG. 20 and FIG. 21, 130 or 140 represents any one or a combination of the phone receiver, the light sensor, the distance sensor, the iris recognition sensor and the fingerprint recognition sensor.

An orthographic projection of one or a combination of the image acquisition structure, a camera, the phone receiver, the light sensor, the distance sensor, the iris recognition sensor and the fingerprint recognition sensor included by the display device, on the display panel is in an orthographic projection of the intermediate area or of the hollow area on the display panel so as to enable the display device to have more application functions and expand the application field of the display device.

The embodiments of the prevent disclosure provide the display panel, the electroluminescent display panel and the display device. By arrangement of the second signal bus line, one end of the first signal line in the first display area in the display panel is electrically connected with the first signal bus line, and the other end of the first signal line is electrically connected with the first conducting wire in the second signal bus line, so that uniformity of a signal input by the first signal line in the first display area can be ensured. Therefore, the structure is not only the precondition of ensuring signal uniformity of the first display area, but is also the precondition of ensuring signal uniformity of the display area of the entire display panel, and may be beneficial for improving the display effects of the display panel, thereby improving the visual experience of the viewer.

It is evident that one person skilled in the art can make various changes or modifications to the present disclosure without departure from the spirit and scope of the disclosure. Thus, if these changes and modifications to the present disclosure are within the scope of the claims of the present disclosure and its equivalent technologies, the present disclosure also intends to include all such changes and modifications within its scope.

What is claimed is:

1. A display panel, comprising:
   a first display area, a second display area, and an intermediate area arranged between the first display area and the second display area,
   wherein the display panel further comprises a first signal bus line and a second signal bus line; the second signal bus line comprises a first conducting wire;
   the first signal bus line at least partially surrounds an edge of the first display area farthest from the intermediate area;
   the second signal bus line at least partially surrounds an edge of the intermediate area closest to the first display area;
   a first signal line is arranged in the first display area; a first end of the first signal line is electrically connected to the first signal bus line and a second end of the first signal line is electrically connected to the first conducting wire.

2. The display panel according to claim 1, wherein the intermediate area is a non-display area.

3. The display panel according to claim 1, wherein the intermediate area is a non-hollow area.

4. The display panel according to claim 1, wherein the display panel further comprises a third signal bus line;
   the third signal bus line at least partially surrounds an edge of the second display area farthest from the intermediate area;
   the second signal bus line further comprises a second conducting wire;
   a second signal line is arranged in the second display area; a first end of the second signal line is electrically connected to the third signal bus line, and a second end of the second signal line is electrically connected to the second conducting wire.

5. The display panel according to claim 4, wherein the first signal bus line is connected to the first conducting wire along the edge of the first display area; or
   the third signal bus line is directly connected to the second conducting wire along the edge of the second display area.

6. The display panel according to claim 4, wherein the first conducting wire and the second conducting wire have a same potential.

7. The display panel according to claim 6, wherein the first conducting wire is connected with the second conducting wire along the edge of the intermediate area.

8. The display panel according to claim 7, wherein a track of the second signal bus line has a U shape.

9. The display panel according to claim 1, wherein a thin film transistor is arranged in the first display area or in the second display area; and
   the thin film transistor is configured to drive the display panel to emit light.

10. The display panel according to claim 9, wherein the second signal bus line and a gate electrode of the thin film transistor are made of a same material and are arranged on a same layer; or
    the second signal bus line and a metal electrode positioned between the gate electrode and a source/drain electrode of the thin film transistor are made of a same material and are arranged on a same layer.

11. The display panel according to claim 9, wherein the second signal bus line and the source/drain electrode of the thin film transistor are made of a same material and are arranged on a same layer.

12. The display panel according to claim 11, wherein a square resistance of the source/drain electrode is between 0.05 ohm/sq and 0.1 ohm/sq.

13. The display panel according to claim 12, wherein the first conducting wire in the second signal bus line is electrically connected with the first signal line through a via hole.

14. The display panel according to claim 1, wherein the second signal bus line is arranged in the intermediate area.

15. The display panel according to claim 14, wherein the display panel is an electroluminescent display panel;
anodes are arranged in both the first display area and the second display area; and
the second signal bus line and the anodes are made of a same material and are arranged on a same layer.

16. The display panel according to claim 1, wherein at least two virtual pixel units are arranged at both the edge of the first display area and an edge of the second display area; and
the second signal bus line is arranged in an area where the at least two virtual pixel units are positioned.

17. The display panel according to claim 16, wherein the display panel is an electroluminescent display panel;
an anode is arranged in the area where the at least two virtual pixel units are positioned; and
the second signal bus line and the anode are made of a same material and are arranged on a same layer.

18. The display panel according to claim 1, wherein the display panel is an electroluminescent display panel;
the first signal line, or a second signal line arranged in the second display area, is a reference signal line; and
the reference signal line is configured to input an initialization signal for the electroluminescent display panel.

19. The display panel according to claim 18, wherein the reference signal line comprises a first metal line and a second metal line arranged on different layers and extending along a same direction; and
the first metal line is electrically connected with the second metal line through a via hole.

20. The display panel according to claim 18, wherein the reference signal line and the first signal bus line have different electrical resistivity.

21. The display panel according to claim 1, wherein the display panel is an electroluminescent display panel;
the first signal line, or a second signal line arranged in the second display area, is a power supply voltage signal line; and
the power supply voltage signal line is configured to drive the electroluminescent display panel to emit light.

22. The display panel according to claim 21, wherein the power supply voltage signal line comprises a third metal line and a fourth metal line arranged on different layers and extending along different directions; and
the third metal line is electrically connected with the fourth metal line through a via hole.

23. The display panel according to claim 1, wherein the display panel further comprises a third display area; and
the first display area, the second display area and the intermediate area are all arranged at a same side edge of the third display area.

24. The display panel according to claim 23, wherein the first display area and the second display area are controlled independent of the third display area, respectively.

25. The display panel according to claim 24, wherein a third signal line is arranged in the third display area; and
the first signal line, and a second signal line arranged in the second display area have voltage signals different from a voltage signal the third signal line has, respectively.

26. The display panel according to claim 24, wherein the first display area, the second display area and the third area all comprise at least two pixel units arranged in an array; and
quantities of at least two rows of pixel units are different.

27. An electroluminescent display panel, comprising a first display area, a second display area, a hollow area arranged between the first display area and the second display area, a first signal bus line, a second signal bus line and a third signal bus line; wherein
the first signal bus line at least partially surrounds an edge of the first display area away from the hollow area;
the second signal bus line at least partially surrounds an edge of the hollow area closest to the first display area and the second display area;
the third signal bus line at least partially surrounds an edge of the second display area away from the hollow area;
a first signal line is arranged in the first display area; a first end of the first signal line is electrically connected to the first signal bus line, and a second end of the first signal line is electrically connected to the second signal bus line;
a second signal line is arranged in the second display area; and a first end of the second signal line is electrically connected with the second signal bus line, and a second end of the second signal line is electrically connected with the third signal bus line.

28. The electroluminescent display panel according to claim 27, wherein the first signal bus line, the second signal bus line and the third signal bus line are made of a same material and are arranged on a same layer;
the first signal line is respectively connected with the second signal bus line and the first signal bus line through via holes; and
the second signal line is respectively connected with the second signal bus line and the third signal bus line through via holes.

29. The electroluminescent display panel according to claim 28, wherein the first signal line and the second signal line are reference signal lines; and
the reference signal lines are configured to input an initialization signal for the electroluminescent display panel.

30. The electroluminescent display panel according to claim 28, wherein the first signal line and the second signal line are power supply voltage signal lines; and
the power supply voltage signal lines are configured to drive the electroluminescent display panel to emit light.

31. The electroluminescent display panel according to claim 27, wherein the electroluminescent display panel further comprises a third display area arranged on a first side of both the first display area and of the second display area.

32. A display device, comprising a display panel comprising:
a first display area, a second display area, and an intermediate area arranged between the first display area and the second display area,
wherein the display panel further comprises a first signal bus line and a second signal bus line; the second signal bus line comprises a first conducting wire;

the first signal bus line at least partially surrounds an edge of the first display area away from the intermediate area;

the second signal bus line at least partially surrounds an edge of the intermediate area closest to the first display area;

a first signal line is arranged in the first display area; a first end of the first signal line is electrically connected to the first signal bus line and a second end of the first signal line is electrically connected to the first conducting wire.

33. The display device according to claim 32, wherein the display device further comprises an image acquisition structure;

the image acquisition structure is arranged in the intermediate area of the display panel.

34. The display device according to claim 33, wherein the display device further comprises one or a combination of a phone receiver, a light sensor, a distance sensor, an iris recognition sensor and a fingerprint recognition sensor; and an orthographic projection on the display panel of one or a combination of the image acquisition structure, a camera, an earpiece, the light sensor, the distance sensor, the iris recognition sensor and the fingerprint recognition sensor, which the display device comprises, is located within an orthographic projection of the intermediate area on the display panel.

\* \* \* \* \*